US008904260B2

(12) United States Patent
Tran et al.

(10) Patent No.: US 8,904,260 B2
(45) Date of Patent: *Dec. 2, 2014

(54) ROBUST HAMMING CODE IMPLEMENTATION FOR SOFT ERROR DETECTION, CORRECTION, AND REPORTING IN A MULTI-LEVEL CACHE SYSTEM USING DUAL BANKING MEMORY SCHEME

(75) Inventors: Jonathan (Son) Hung Tran, Murphy, TX (US); Abhijeet Ashok Chachad, Plano, TX (US); Joseph Raymond Michael Zbiciak, Arlington, TX (US); Krishna Chaithanya Gurram, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 514 days.

This patent is subject to a terminal disclaimer.

(21) Appl. No.: 13/243,370

(22) Filed: Sep. 23, 2011

(65) Prior Publication Data

US 2012/0192027 A1 Jul. 26, 2012

Related U.S. Application Data

(60) Provisional application No. 61/387,283, filed on Sep. 28, 2010.

(51) Int. Cl.
| | | |
|---|---|---|
| H03M 13/00 | (2006.01) | |
| G11C 29/00 | (2006.01) | |
| G06F 11/10 | (2006.01) | |
| G06F 7/483 | (2006.01) | |
| G06F 9/30 | (2006.01) | |
| H03M 13/35 | (2006.01) | |
| H03M 13/29 | (2006.01) | |
| H03K 19/00 | (2006.01) | |
| G06F 1/32 | (2006.01) | |
| H03K 21/00 | (2006.01) | |
| G06F 12/02 | (2006.01) | |

(52) U.S. Cl.
CPC ............ *G06F 11/1064* (2013.01); *G06F 7/483* (2013.01); *G06F 9/3012* (2013.01); *H03M 13/353* (2013.01); *H03M 13/2903* (2013.01); *H03K 19/0016* (2013.01); *G06F 1/3296* (2013.01); *H03K 21/00* (2013.01); *G06F 12/0246* (2013.01); *Y02B 60/32* (2013.01)
USPC ........................... 714/773; 714/757; 714/774

(58) Field of Classification Search
CPC ............ G06F 11/1064; H03M 13/353; H03M 13/2903
USPC .......................................... 714/757, 774, 773
See application file for complete search history.

(56) References Cited

U.S. PATENT DOCUMENTS

| | | | | |
|---|---|---|---|---|
| 5,579,303 A * | 11/1996 | Kiriyama | ...................... | 370/252 |
| 5,671,237 A * | 9/1997 | Zook | .............................. | 714/755 |
| 5,687,181 A * | 11/1997 | Suemura et al. | .............. | 714/757 |
| 5,856,988 A * | 1/1999 | Kiriyama | ...................... | 714/774 |
| 6,735,735 B1 * | 5/2004 | Ohira et al. | .................... | 714/776 |

(Continued)

*Primary Examiner* — Joseph D Torres
(74) *Attorney, Agent, or Firm* — Robert D. Marshall, Jr.; Frederick J. Telecky, Jr.

(57) ABSTRACT

The invention is a memory system having two memory banks which can store and recall with memory error detection and correction on data of two different sizes. For writing separate parity generators form parity bits for respective memory banks. For reading separate parity detector/generators operate on data of separate memory banks.

7 Claims, 9 Drawing Sheets

(56) References Cited

U.S. PATENT DOCUMENTS

| | | | |
|---|---|---|---|
| 6,810,501 B1* | 10/2004 | Ferguson et al. | 714/781 |
| 7,093,185 B2* | 8/2006 | Kim et al. | 714/790 |
| RE40,684 E* | 3/2009 | Keller | 714/757 |
| 8,051,359 B2* | 11/2011 | Lin et al. | 714/757 |
| 2011/0066918 A1* | 3/2011 | Ramaraju et al. | 714/757 |
| 2012/0198310 A1* | 8/2012 | Tran et al. | 714/763 |

* cited by examiner (1) L1I CACHE MISS FILL FROM L2
(2) L1D CACHE MISS FILL FROM L2
(3) L1D WRITE MISS TO L2, OR L1D VICTIM TO L2, OR L1D SNOOP RESPONSE TO L2
(4) L2 CACHE MISS FILL, OR DMA INTO L2
(5) L2 VICTIM WRITE BACK, OR DMA OUT OF L2
(6) DMA INTO L2
(7) DMA OUT OF L2

| 31 | 29 | 28 | 27 | 23 | 22 | 18 | 17 | 13 | 12 | | 2 | 1 | 0 |
|---|---|---|---|---|---|---|---|---|---|---|---|---|---|
| creg | | z | dst | | src2 | | scr1/cst | | opcode | | | s | p |

| 31 | | 24 23 | | 16 15 | | 10 9 | 8 | 7 | 6 | 5 | 4 | 3 | 2 | 1 | 0 |
|---|---|---|---|---|---|---|---|---|---|---|---|---|---|---|---|
| RSV | | BITPOS | | RSV | | | NERR | VERR | DMAERR | IERR | DERR | SUSP | DIS | RSV | EN |
| R,+0000000 | | R,+00000000 | | R,+000000 | | | R,+00 | R,+0 | R,-0 | R,+0 | R,+0 | R,+0 | R,+1 | R,+0 | R,+0 |

FIG. 10

| 31 | | | | 5 | 4 | 3 | 2 | 1 | 0 |
|---|---|---|---|---|---|---|---|---|---|
| ADDR | | | | | L2WAY | | RSV | | SRAM |
| R, +00000000000000000000000000 | | | | | R, +00 | | R, +00 | | R, +0 |

FIG. 11

| 31 | | 8 | 7 | 6 | 5 | 4 | 3 | 2 | 1 | 0 |
|---|---|---|---|---|---|---|---|---|---|---|
| Reserved | | | VCLR | DMACLR | ICLR | DCLR | SUSP | DIS | RSV | EN |
| R,+00000000000000000000 | | | W,+0- | W,+0 | W,+0 | W,+0 | W,+0 | W,+0 | R,+0 | W,+0 |

FIG. 12

| 31 | 8 | 7 | 0 |
|---|---|---|---|
| Reserved | | CNT | |
| R,+000000000000000000 | | RC,+00000000000000000000000000 | |

L2EDCPEC

| 31 | 8 | 7 | 0 |
|---|---|---|---|
| Reserved | | CNT | |
| R,+000000000000000000 | | RC,+00000000000000000000000000 | |

L2EDNPEC

FIG. 13

| 31 | | 5 | 4 | 3 | 2 | 1 | 0 |
|---|---|---|---|---|---|---|---|
| Reserved | | | SDMAEN | PL2SEN | DL2SEN | PL2CEN | DL2CEN |
| R,+0 | | | W,+1 | W,+1 | W,+1 | W,+1 | W,+1 |

*FIG. 14*

ROBUST HAMMING CODE IMPLEMENTATION FOR SOFT ERROR DETECTION, CORRECTION, AND REPORTING IN A MULTI-LEVEL CACHE SYSTEM USING DUAL BANKING MEMORY SCHEME

CLAIM OF PRIORITY

This application claims priority under 35 U.S.C. 119(e)(1) to U.S. Provisional Application No. 61/387,283 filed Sep. 28, 2010.

TECHNICAL FIELD OF THE INVENTION

The technical field of this invention is cache for digital data processors.

BACKGROUND OF THE INVENTION

Various types of radiation such as neutrons and alpha particles can directly or indirectly cause soft errors in memories. The error rate goes up as device size decreases and as memory size increases. For a cache based system with a unified second level cache, the error could be either in data, instructions or direct memory access (DMA) transfer data. An error in an instruction can cause unexpected behavior in the data processor. Having the ability to correct such an instruction before it reaches the central processing unit (CPU) can prevent this behavior. CPU and DMA data have components which remain static for a long time making them susceptible to these soft errors. This data needs to be protected against corruption due from soft errors. Typically, this data remains in the level 2 cache for long durations. Protecting data at this level of the memory hierarchy is most effective.

The information required for this protection depends on the type of detection/correction required. Complete data correction requires a lot of information. This may can prove costly in terms of area and memory bits. Efficient implementation of the generation and decode of this information is required for high performance devices.

SUMMARY OF THE INVENTION

The invention claimed is a robust method for error code generation and detection in a multi-level cache system using a dual banking memory scheme.

The memory system includes a first data source of N and a second data source of 2N bits. A first parity generator forms parity bits of N bits of the first data source. Second and third parity generators form parity bits of respective N upper half bits and N lower half bits of the second data source. A set of multiplexers permit N bit data from the first data source and associated parity bits to be stored in either of two memory banks or to store 2N bits and associated parity bits from the second data source to be stored across both memory banks.

The memory system includes first and second parity detector/corrector connected to respective memory banks. These parity detector/correctors compare recalled parity bits from the respective memory banks to newly generated parity formed from recalled data. If the parity bits match, the recalled data is supplied to a data output. If the parity bits do not match, the parity detector/corrector attempts to form corrected data from the recalled data and parity bits. If successful, this corrected data is output. The output data could be N bits from a single memory bank or 2N bits from both memory banks.

BRIEF DESCRIPTION OF THE DRAWINGS

These and other aspects of this invention are illustrated in the drawings, in which:

FIG. 10 illustrates the fields of the L2 Error Detection Status Register of this invention;

FIG. 11 illustrates the fields of the L2 Error Detection Address Register of this invention;

FIG. 12 illustrates the fields of the UMC Error Detection Command Register of this invention;

FIG. 13 illustrates the fields of two Error Detection Event Counters of this invention; and FIG. 14 illustrates the fields of the L2 error detection and correction enable register of this invention.

DETAILED DESCRIPTION OF PREFERRED EMBODIMENTS

Figure 1:
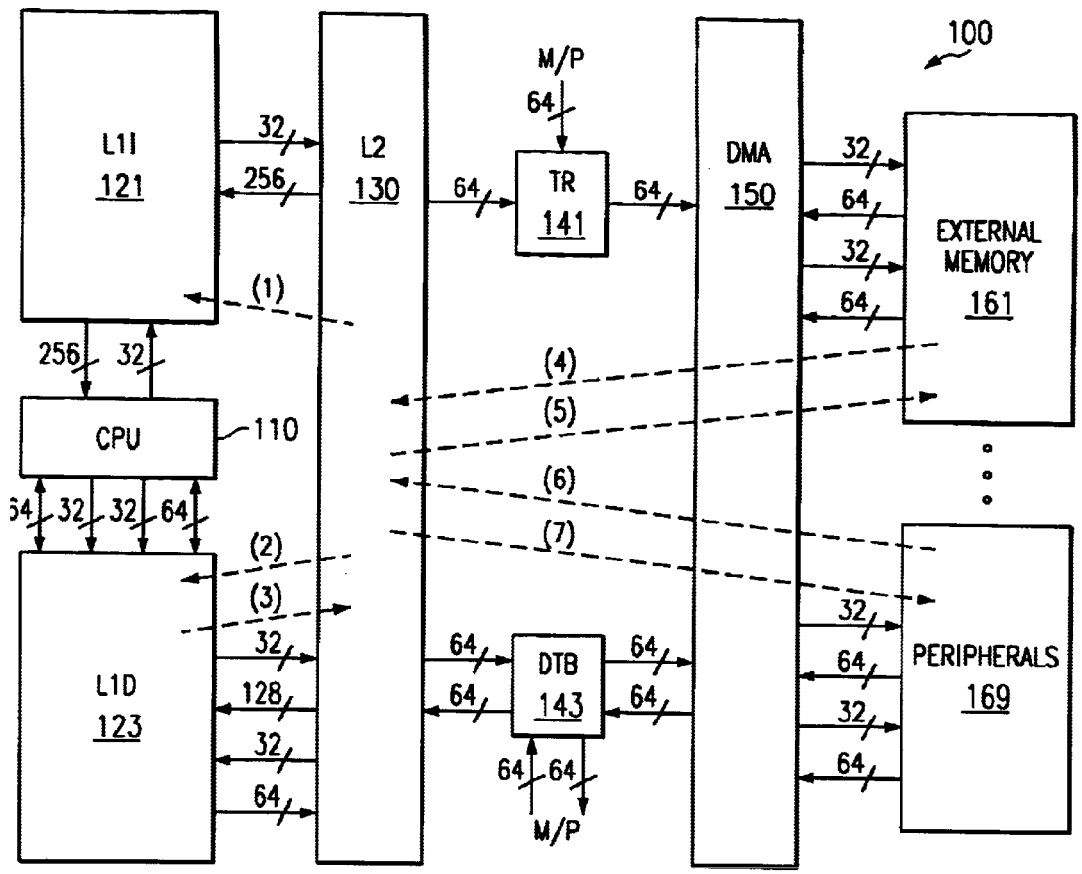
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

FIG. 1 illustrates several data/instruction movements within the digital signal processor system 100. These include: (1) instructions move from L2 cache 130 to L1I cache 121 to fill in response to a L1I cache miss; (2) data moves from L2 cache 130 to L1D cache 123 to fill in response to a L1D cache miss; (3) data moves from L1D cache 123 to L2 cache 130 in response to a write miss in L1D cache 123, in response to a L1D cache 123 victim eviction and in response to a snoop from L2 cache 130; (4) data moves from external memory 161 to L2 cache 130 to fill in response to L2 cache miss or a direct memory access (DMA) data transfer into L2 cache 130; (5) data moves from L2 cache 130 to external memory 161 in response to a L2 cache victim eviction or writeback and in response to a DMA transfer out of L2 cache 130; (6) data moves from peripherals 169 to L2 cache 130 in response to a DMA transfer into L2 cache 130; and (7) data moves from L2 cache 130 to peripherals 169 is response to a DMA transfer out of L2 cache 130.

Figure 2:
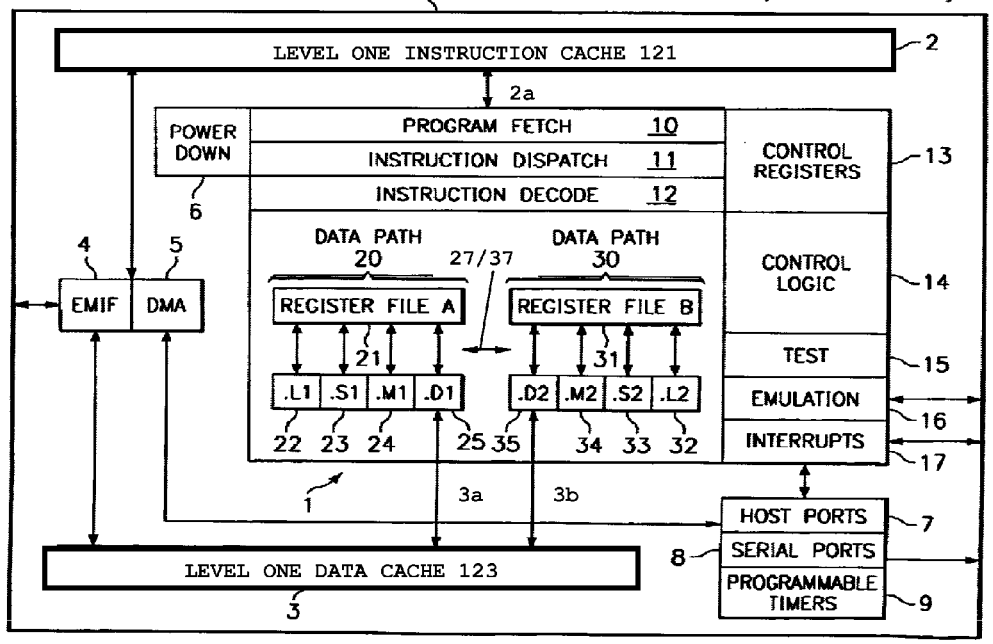
FIG. 2 illustrates details of a very long instruction word digital signal processor core suitable for use in FIG. 1 (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
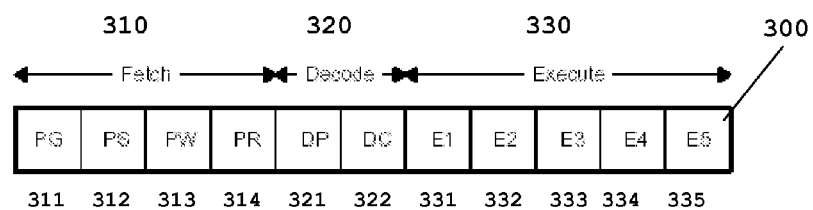
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

Figures 4, 5:
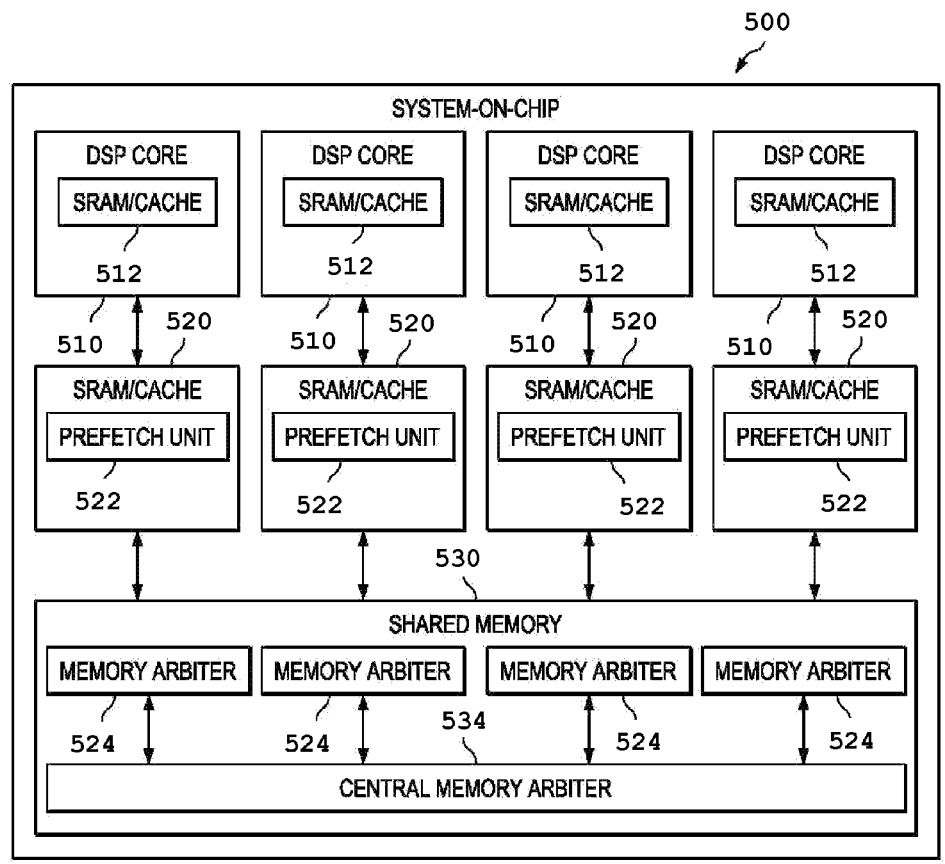
FIG. 4 illustrates the instruction syntax of the very long instruction word digital signal processor core illustrated in FIG. 2 (prior art)
FIG. 5 illustrates a computing system including a local memory arbiter according to an embodiment of the invention.

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| Conditional Register | creg | | | z |
|---|---|---|---|---|
| | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

FIG. 5 is a block diagram illustrating a computing system including a local memory arbiter according to an embodiment of the invention. FIG. 5 illustrates system on a chip (SoC) 500. SoC 500 includes one or more DSP cores 510, SRAM/Caches 520 and shared memory 530. SoC 500 is preferably formed on a common semiconductor substrate. These elements can also be implemented in separate substrates, circuit boards and packages. For example shared memory 530 could be implemented in a separate semiconductor substrate. FIG. 5 illustrates four DSP cores 510, but SoC 500 may include fewer or more DSP cores 510.

Each DSP core 510 preferably includes a level one data cache such as L1 SRAM/cache 512. In the preferred embodiment each L1 SRAM/cache 512 may be configured with selected amounts of memory directly accessible by the corresponding DSP core 510 (SRAM) and data cache. Each DSP core 510 has a corresponding level two combined cache L2 SRAM/cache 520. As with L1 SRAM/cache 512, each L2 SRAM/cache 520 is preferably configurable with selected amounts of directly accessible memory (SRAM) and data cache. Each L2 SRAM/cache 520 includes a prefetch unit 522. Each prefetch unit 522 prefetchs data for the corresponding L2 SRAM/cache 520 based upon anticipating the needs of the corresponding DSP core 510. Each DSP core 510 is further coupled to shared memory 530. Shared memory 530 is usually slower and typically less expensive memory than L2 SRAM/cache 520 or L1 SRAM/cache 510. Shared memory 530 typically stores program and data information shared between the DSP cores 510.

In various embodiments, each DSP core 510 includes a corresponding local memory arbiter 524 for reordering memory commands in accordance with a set of reordering rules. Each local memory arbiter 524 arbitrates and schedules memory requests from differing streams at a local level before sending the memory requests to central memory arbiter 534. A local memory arbiter 524 may arbitrate between more than one DSP core 510. Central memory arbiter 534 controls memory accesses for shared memory 530 that are generated by differing DSP cores 510 that do not share a common local memory arbiter 524.

Figure 6:
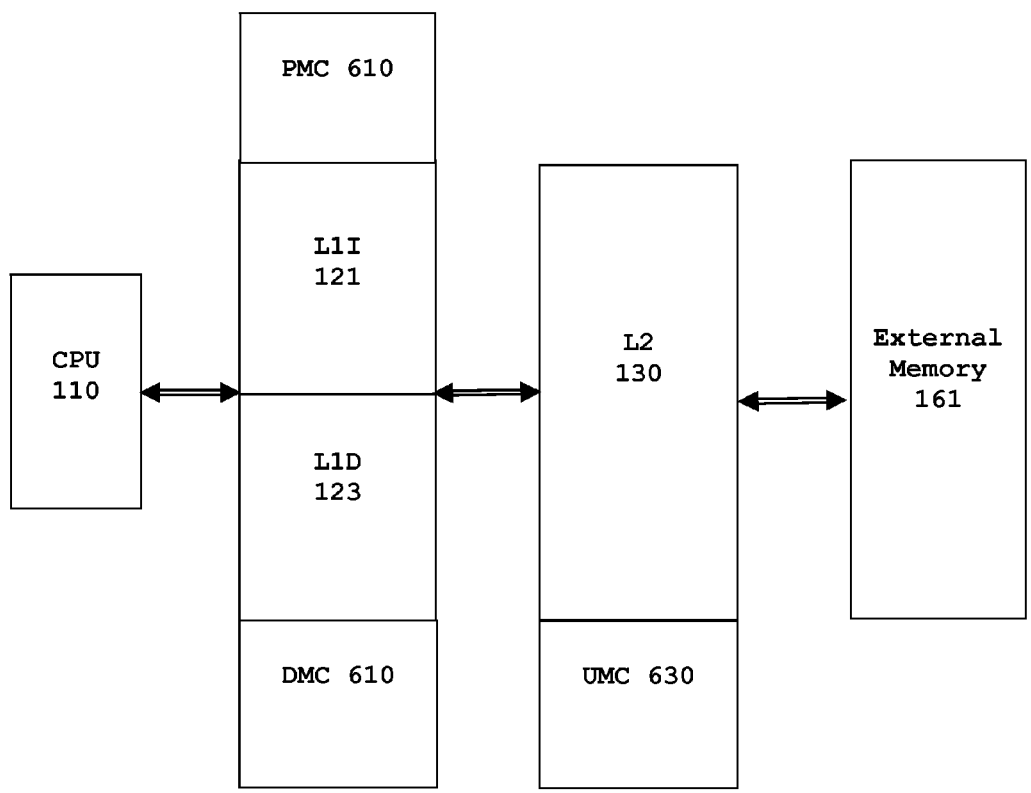
FIG. 6 is a further view of the digital signal processor system of this invention showing various cache controllers.

FIG. 6 is a further view of the digital signal processor system 100 of this invention. CPU 110 is bidirectionally connected to L1I cache 121 and L1D cache 123. L1I cache 121 and L1D cache 123 are shown together because they are at the same level in the memory hierarchy. These level one caches are bidirectionally connected to L2 130. L2 cache 130 is in turn bidirectionally connected to external memory 161 and peripherals 169. External memory 161 and peripherals 169 are shown together because they are at the same level in the memory hierarchy. Data transfers into and out of L1D cache 123 is controlled by data memory controller (DMC) 610. Data transfers into and out of L1I cache 121 is controlled by program memory controller (PMC) 620. Data transfers into and out of L2 130 including both cache and directly addressable memory (SRAM) are controlled by unified memory controller (UMC) 630. This application is primarily concerned with level 2 cache and UMC 630.

UMC 630 provides soft error protection for data and instruction code held in the L2 cache 130 including both cache and direct mapped memory. L2 cache 130 may be selectively partitioned between cache and directly accessed memory (SRAM). The primary purpose is to protect instructions and largely static data held in L2 cache 130. Because the likelihood of a bit error on a given bit is proportional to the time since it was last written, and program images are rarely written, the focus of Error Detection and Correction (EDC) of this invention is on those portions of L2 cache 130 that are written to rarely but must be correct when read.

The preferred embodiment of this invention implements an EDC with a distance-4 detect 2, correct 1 Hamming code. UMC 630 always performs a full Hamming Code check on 256-bit reads originating from program memory controller (PMC) and L2 victim readouts. UMC 630 performs a full Hamming Code check on 128-bit reads from internal direct memory access (IDMA) or direct memory access (DMA). UMC 630 also performs a 256-bit parity/Hamming code check for 256-bit fetches from DMC 610.

A device which incorporates EDC always performs full EDC on all program fetches from PMC and full EDC on L2 victim readouts. Full EDC on 128-bit wide DMA accesses is also performed. The EDC provides both parity-check based and Hamming code based single-bit Error-Detection and Hamming code based two-bit Error-Detection on data fetches from DMC 610. EDC correction for DMC 610 accesses are not performed as this would add an extra cycle on DMC 610 data return. The error detection and exceptions are performed after the data is returned to DMC 610. This removes the error detection delay from the cost of L1D cache 123 misses.

The EDC scheme uses additional memory bits to hold parity data. EDC checks and corrections are performed on all program fetches of 256-bits on a 256-bit boundary and 128-bits on a 128-bit boundary for DMA/IDMA accesses if configured. All L1I cache 121 line fills are checked and corrected if configured. All DMA/IDMA and L2 cache 130 victim readouts are checked corrected if configured. All L1D cache 123 line fills are parity-checked and Hamming code checked only.

This behavior is controlled through various configuration registers which allow the user to control which access requestor need EDC detection/correction. These control registers also provide global settings such as enable, suspend and disable. EDC parity generation is always enabled except during suspend mode. The controller takes various exceptions on detecting or correcting errors, returns status with read data and logs information on the error. This information includes the error address, source of error and type of error. For a single correctable bit error this information records the bit position.

A feature commonly referred to as scrubbing uses an internal DMA (IDMA) engine to access both direct mapped and cache sections of L2 cache 130 and regenerate parity and the hamming code.

UMC 630 has two physical static random access memory (SRAM) banks. Each bank is 140 bits wide and stores both data and Hamming code parity information. UMC 130 stores 12 bits of parity/valid bit information for every 128 bits of data for each physical bank. The generation of the Hamming bits and parity bits uses a modular constant and can be programmable during integration depending on the data path width. The parity data includes two parity only bits 2 per physical bank and one for each 64-bit half-data. These two parity bits are used for a quick detect of 1-bit parity errors. There is a valid bit which qualifies the parity data as valid or invalid.

The error position is decoded via an exclusive OR (XOR) of the computed Hamming parity and the received Hamming parity. This value will be the exact bit position of the error within the received codeword. This technique works whether the error is in the parity or the original data. The XOR of the computed parity and the received parity is called the syndrome. A syndrome of 0 indicates no error. A non-zero syndrome indicates the bit position of the error.

The above scheme is sufficient to detect and correct a single bit error. It cannot reliably detect a double bit error. When a double bit error does occur, the decoding process either reports an invalid single-bit error bit position or reports no error. An additional bit of parity is required to reliably detect a double-bit error. The additional bit is the parity of the data and the Hamming parity together called the all-bits parity. This all-bits parity is used for 2-bit error detection.

This additional bit is simply the parity of all the code bits including the inserted parity bits. The all-bits parity extends the code so that the minimum Hamming distance between any two codewords is now 4. In this extended code, a single-bit error is indicated when the all-bits-parity is incorrect and the syndrome is non-zero. A double-bit or other non-correctable error is indicated when the all-bits parity is correct and the syndrome is non-zero or when the all-bits parity is incorrect and the syndrome is outside the range of the codeword size.

This solution optimizes the number of bits used for error detection and correction. This solution provides quick decodes to detect 1-bit and 2-bit errors. This solution also detects errors in the Hamming code. Since most of the data access is in blocks of 256 bits across both banks, the number of Hamming bits have been reduced to take advantage of this. Each 128-bit data per bank has its own Hamming code. This provides greater protection on a full 256-bit access, since a single-bit error in independent banks can be corrected.

Figure 7:
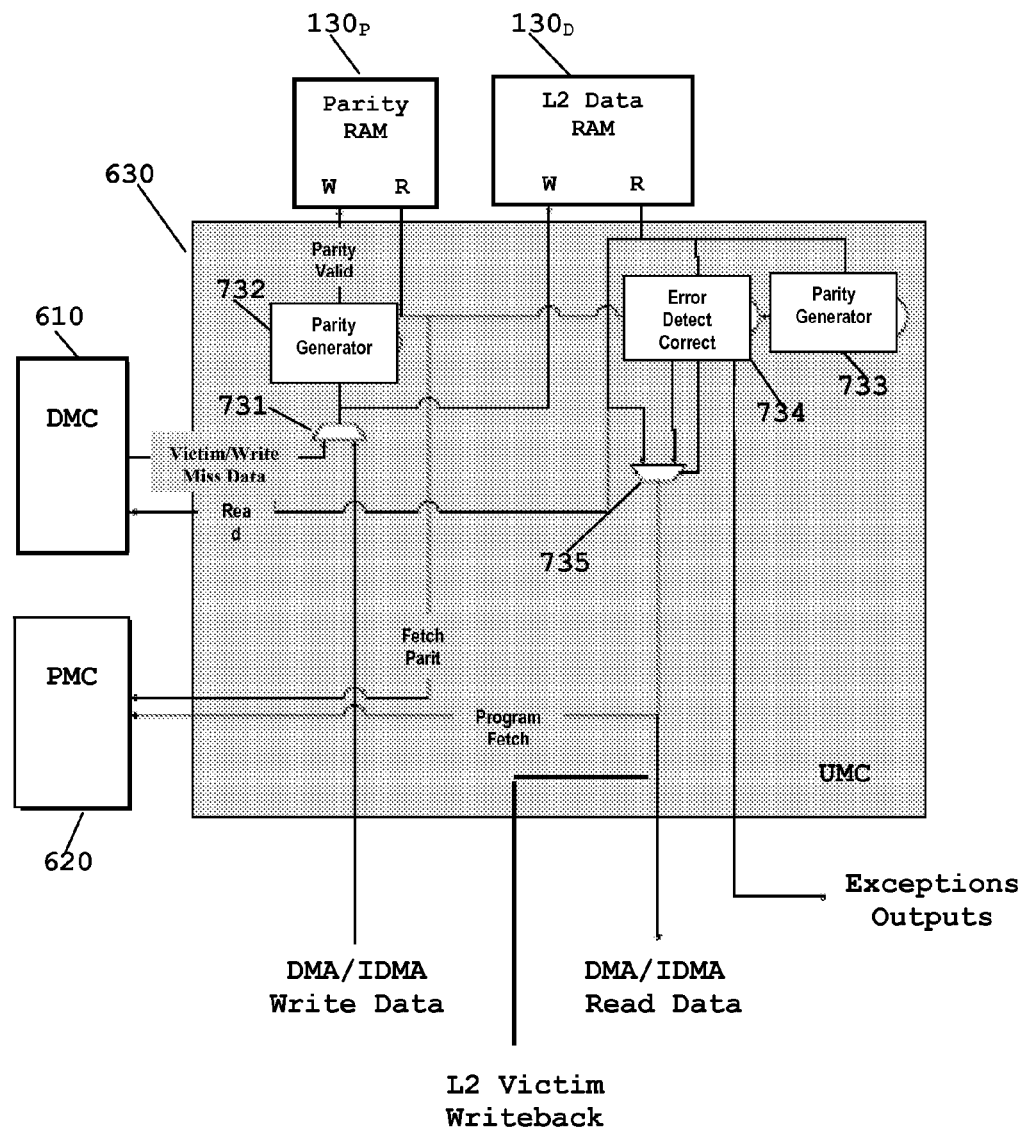
FIG. 7 illustrates the soft error protection system of this invention.
Figure 8:
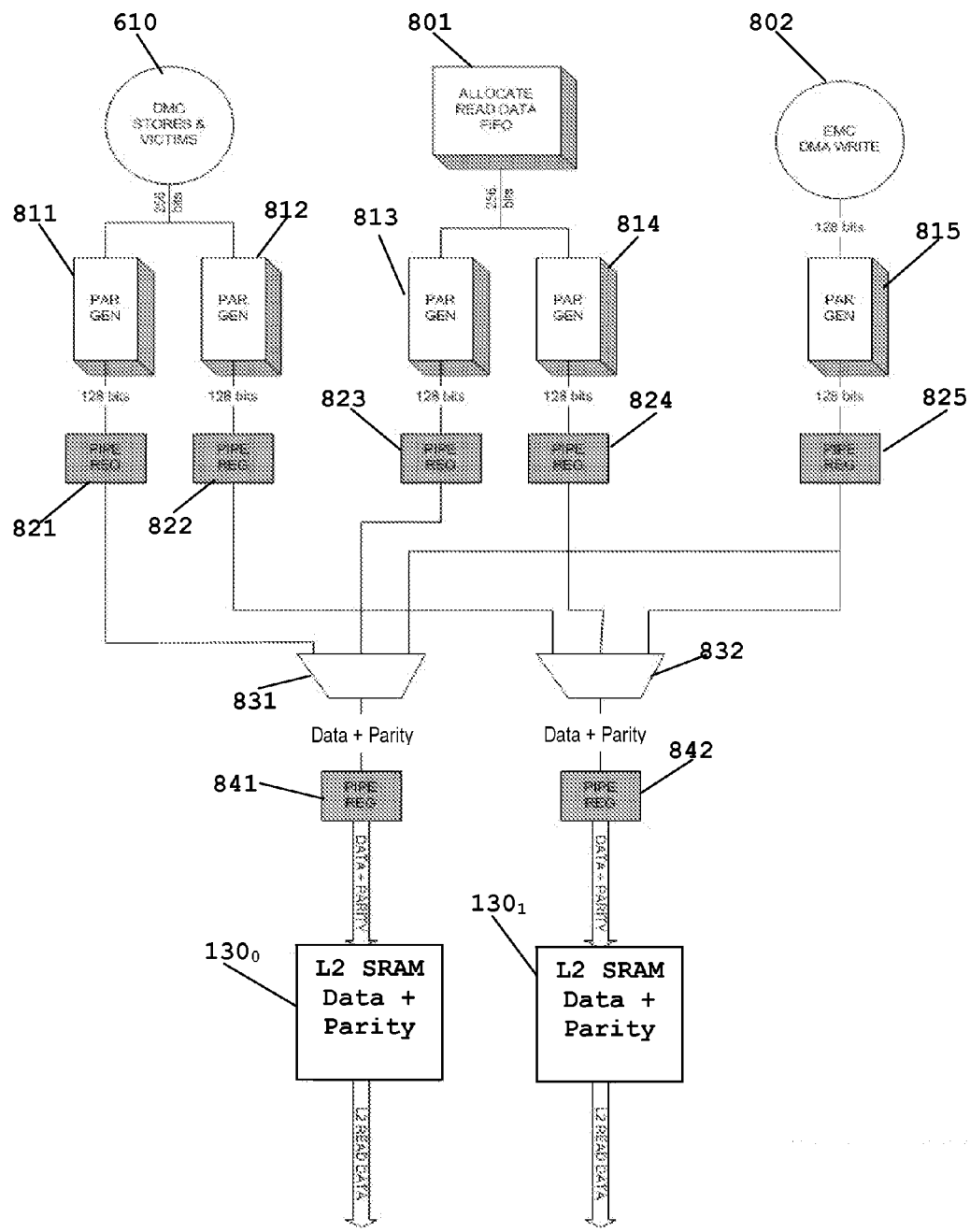
FIG. 8 illustrates further details of the parity generation process for a write operation into the level two cache of this invention.
Figure 9:
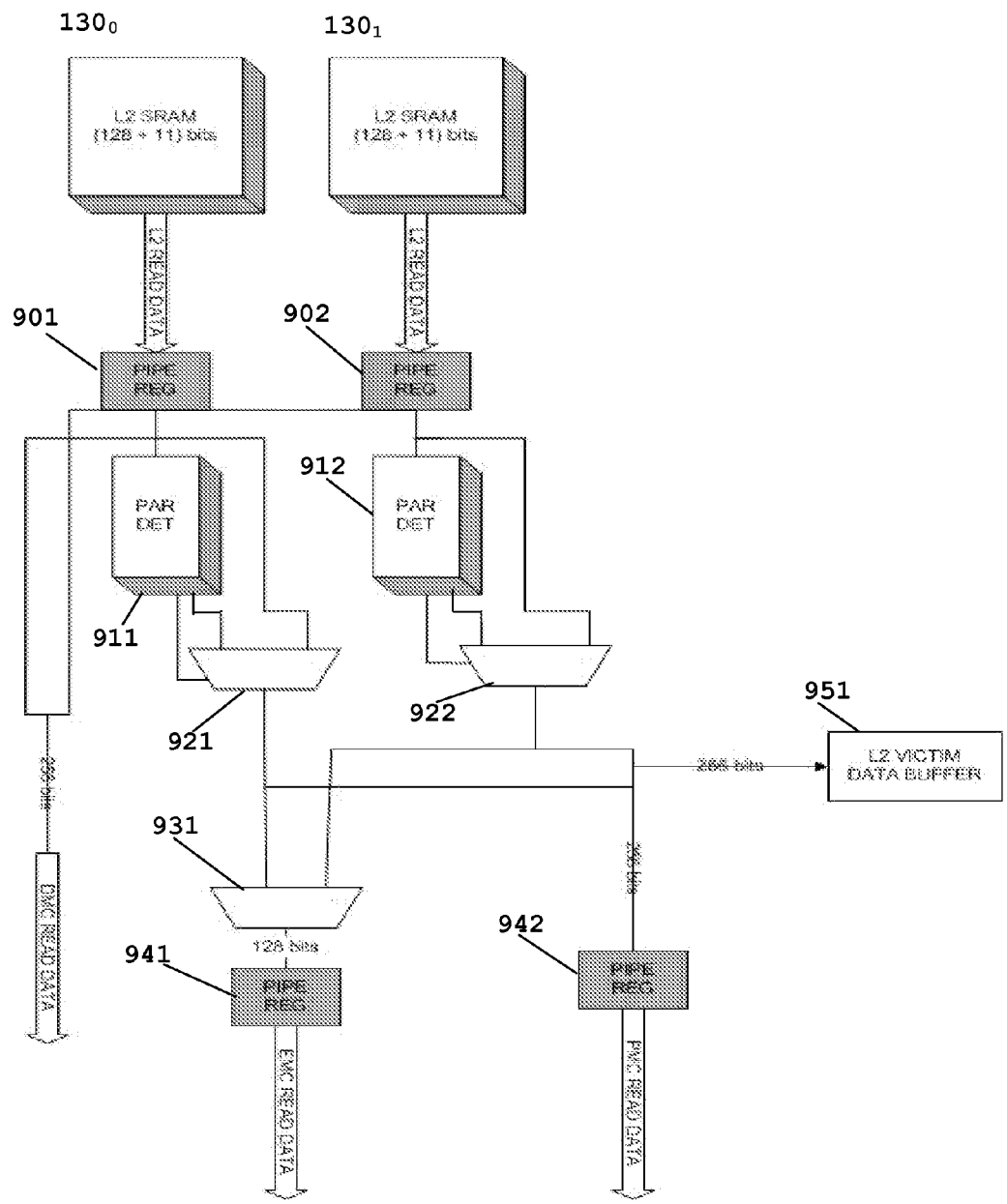
FIG. 9 illustrates further details of the parity generation process for a read operation from the level two cache of this invention.

FIGS. 7, 8 and 9 below illustrate both the data path for the Hamming code generation and Hamming code detection and correction logic.

This solution protects memory depending on actual use cases. Instruction code is mostly static but needs to be correct when read. This instruction code gets 2-bit error detection and 1-bit error detection/correction. Data from both CPU 110 and DMA has 1-bit error detection. There are a number of resources to control the behavior at multiple levels. There are global controls which let the user disable, enable or temporarily suspend EDC protection for the entire memory. There are requestor based enables which let the user do this at much more granular level.

In case of an error in either of the banks being detected or corrected, information corresponding to that data is logged. Since there are two banks, the reporting mechanism provides exact bit location of the error for that particular bank. The user can then use this information to re-fetch, invalidate or correct the data in software.

The solution also uses the fact that most data accesses are in burst of 256-bits. In the preferred embodiment DMA/IDMA transfers are in bursts of 128-bits. This invention uses lesser bits for protection. Each 128-bit bank has its own Hamming code and thus provides greater protection on a full 256-bit access. Thus a single-bit error in independent banks can be corrected. The solution corrects code, but only detects errors for data for a DMC 610 access. Code correction is very crucial, but data detection is sufficient since the error information that is recorded by the controller, can be used to correct data.

FIG. 7 illustrates the soft error protection system of this invention. Note FIG. 7 illustrates only data flow and does not show distribution of addresses for clarity. FIG. 7 illustrates DMC 610, PMC 620, UMC 630, parity RAM 130$_P$ and L2 data RAM 130$_D$. DMC 610 supplies victim write data to one input of multiplexer 731. DMA and IDMA write data for L2 data RAM 130$_D$ supplies the other input of multiplexer 731. Multiplexer 731 selects one of its inputs for output.

Writes to L2 cache 130 occurs as follows. The output of multiplexer 731 supplies the input of parity generator 732 and the write input of L2 data RAM 130$_D$. By this data routing parity generator 732 generates parity bits corresponding to the data being stored in L2 data RAM 130$_D$. The parity and validity bits of parity generator 732 supplies the write input of parity RAM 130$_P$. The same address is supplied to both parity RAM 130$_P$ and L2 data RAM 130$_D$ (not shown in FIG. 7). Thus the data and parity are stored in corresponding locations in parity RAM 130$_P$ and L2 data RAM 130$_D$.

Reads from L2 cache 130 occurs as follows. Data is recalled from L2 data RAM 130$_D$ simultaneously with recall of the corresponding parity bits from parity RAM 130$_P$. The same address is supplied to both parity RAM 130$_P$ and L2 data RAM 130$_D$ (not shown in FIG. 7). The data is supplied to four places. The data recalled from L2 data RAM 130$_D$ is supplied directly to DMC 610. L1D cache 123 does not store parity bits and thus these are not supplied to DMC 610. The data recalled from L2 data RAM 130$_D$ is supplied to one input of multiplexer 735. The data recalled from L2 data RAM 130$_D$ is also supplied parity generator 733 and error detect/correct unit 734. Parity generator 733 operates the same as parity generator 732 forming parity bits corresponding to the data recalled from L2 data RAM 130$_D$. Parity generator 733 supplies these parity bits to error detect/correct unit 734. Error detect/correct unit 734 also receives parity bits recalled from parity RAM 130$_P$. Error detect/correct unit 734 compares the newly formed parity bits with the recalled parity bits. If these are the same, then error detect/correct unit 734 controls multiplexer 735 to select the data just recalled from L2 data RAM 130$_D$. The output of multiplexer 735 is supplied to PMC 620 together with the parity bits recalled from parity RAM 130$_P$. This supplies a program fetch generating a cache miss in L1I cache 121 if PMC 620 was the requestor. L1I cache 121 stores the combined parity bits and data for internal error correction. This is done because instructions stored in L1I cache 121 have a long life and are more subject to soft errors. The output of multiplexer 735 is supplied to the DMA/IDMA read data output without the parity bits. This data channel does not use further error detection/correction and does not use the parity bits. The output of multiplexer 735 lastly supplies a L2 victim output to external memory without the parity bits. This data channel does not use further error detection/correction and does not use the parity bits.

If error detect/correct unit 734 determines the just generated parity bits do not match the recalled parity bits, error detect/correct unit 734 attempts to correct the data. If error detect/correct unit 734 successfully corrects the data, it supplies the corrected data to the second input of multiplexer 735. Error detect/correct unit 734 controls multiplexer 735 to output this correct data to PMC 620 and the DMA/IDMA read data output. When error detect/correct unit 734 cannot correct the data, it signals the error at exceptions output. Generally the read also aborts.

FIG. 8 illustrates further details of the parity generation process for a write operation into parity RAM 130$_P$ and L2 data RAM 130$_D$. FIG. 8 illustrates only data flow and does not show distribution of addresses for clarity. FIG. 8 illustrates accommodation of different data widths of data sources. FIG. 8 illustrates two memory banks, L2 cache bank 0 130$_0$ and L2 cache bank 1 130$_1$. Each of these memory banks L2 cache bank 0 130$_0$ and L2 cache bank 1 130$_1$ include a bank of parity RAM 130$_P$ and a corresponding bank of L2 data RAM 130$_D$.

In the preferred embodiment DMC 610 write data from stores and victims to L2 cache 130 has a data width of 256 bits. This 256-bit data is divided into an upper half 128 bits supplied to parity generator 811. Parity generator 811 generates corresponding parity bits on the upper half data and supplies the combined data and parity bits for temporary storage in pipeline register 821. A lower half 128 bits of this 256-bit data is supplied to parity generator 812. Parity generator 812 generates corresponding parity bits on the lower half data and supplies the combined data and parity bits for temporary storage in pipeline register 822. In the preferred embodiment read allocate data from allocate read data FIFO 801 has a data width of 256 bits. This 256-bit data is divided into an upper half 128 bits supplied to parity generator 813. Parity generator 813 generates corresponding parity bits on the upper half data and supplies the combined data and parity bits for temporary storage in pipeline register 823. A lower half 128 bits of this 256-bit data is supplied to parity generator 814. Parity generator 814 generates corresponding parity bits on the lower half data and supplies the combined data and parity bits for temporary storage in pipeline register 824. In the preferred embodiment DMA write data from external memory controller (EMC) 802 has a data width of 128 bits. This 128 bits is supplied to parity generator 815. Parity generator 815 generates corresponding parity bits and supplies the combined data and parity bits for temporary storage in pipeline register 825.

Multiplexers 831 and 832 control supply of write data to two memory banks, L2 cache bank 0 130$_0$ and L2 cache bank 1 130$_1$. When storing a store or victim from DMC 610, multiplexer 831 selects upper half data stored in pipeline register 821 and multiplexer 832 selects lower half data stored in pipeline register 822. The output of multiplexer 831 is temporarily stored in pipeline register 841 for storage in L2 cache bank 0 130$_0$. The output of multiplexer 832 is temporarily stored in pipeline register 842 for storage in L2 cache bank 1 130$_1$. Each of L2 cache bank 0 130$_0$ and L2 cache bank 1 130$_1$ stores the combined data and parity bits.

When storing read allocate data from allocate read data FIFO 801, multiplexer 831 selects upper half data stored in pipeline register 823 and multiplexer 832 selects lower half data stored in pipeline register 824. Each of L2 cache bank 0 130$_0$ and L2 cache bank 1 130$_1$ stores the combined data and parity bits.

Storing data from EMC 802 depends on the storage address. This 128-bit data is stored in only one of L2 cache bank 0 $130_0$ and L2 cache bank 1 $130_1$. If the storage address is an upper address, multiplexer 831 selects the EMC 802 data stored in pipeline register 825 and multiplexer 832 makes no selection outputting no data. This data is temporarily stored in pipeline register 841 before storage in L2 cache bank 0 $130_0$. If the storage address is a lower address, multiplexer 831 makes no selection outputting no data and multiplexer 832 selects the EMC 802 stored in pipeline register 825. This data is temporarily stored in pipeline register 842 before storage in L2 cache bank 1 $130_1$.

FIG. 9 illustrates further details of the parity generation process for a read operation from parity RAM $130p$ and L2 data RAM $130_D$. Note FIG. 9 illustrates only data flow and does not show distribution of addresses for clarity. FIG. 9 illustrates accommodation of different data widths of data sources. As shown in FIG. 8, FIG. 9 illustrates two memory banks, L2 cache bank 0 $130_0$ and L2 cache bank 1 $130_1$, each including a bank of parity RAM $130_P$ and a corresponding bank of L2 data RAM $130_D$.

A read from L2 cache 123 preferably includes a 128-bit read from L2 cache bank 0 $130_0$ together with the associated parity bits and a corresponding 128-bit read from bit L2 cache bank 1 $130_1$ together with the associated parity bits. Data read from L2 cache bank 0 $130_0$ is temporarily stored in pipeline register 901. Data read from L2 cache bank 1 $130_1$ is temporarily stored in pipeline register 902. The 256-bit data only without the associated parity bits is supplied to DMC 610 as read data as previously shown in FIG. 7.

The data and parity bits stored in pipeline register 901 is supplied to parity detector/corrector 911. Similarly, the data and parity bits stored in pipeline register 902 is supplied to parity detector/corrector 912. Each of parity detector/correctors 911 and 912 control corresponding multiplexers 921 and 922. The combination of parity detector/corrector 911 and multiplexer 921 corresponds to a 128-bit portion of parity generator 733, error detect/correct unit 734 and multiplexer 735 illustrated in FIG. 7. Similarly the combination of parity detector/corrector 912 and multiplexer 922 corresponds to the other 128-bit portion of parity generator 733, error detect/correct unit 734 and multiplexer 735. For each 128-bit portion these parts generate the corresponding parity and compare it with the recalled parity bits. If the parities match, multiplexers 921 and 922 select the recalled data for forwarding to the read destination. If the parities do not match, the corresponding parity detector 911 or 912 attempts to correct the data. If this correction is successful, multiplexers 921 and 922 select the corrected data for forwarding to the read destination. The read operation aborts if correction is not successful.

This data is distributed as follows. Multiplexer 931 selects a 128-bit portion of the data from either multiplexer 921 or multiplexer 922 for supply to pipeline register 941 as EMC read data. This includes the data only and not the associated parity bits. Pipeline register 942 receives both data and parity bits from multiplexer 921 and multiplexer 922 for supply as PCM read data. Multiplexer 921 and multiplexer 922 together supply 256-bit data only and not the associated parity bits to L2 victim data buffer 951.

The following error status reporting and control registers are used in the preferred embodiment of this invention. A notation below each register field includes its attributes. The first portion of the attributes is R for read only or W for write only. The latter portion is the default register field state upon startup.

Error Detection Status (L2EDSTAT)

When an uncorrectable error is detected (2 bits for instruction code, 1 or 2 bits for data), an interrupt is sent to CPU 110. At the same time error information is recorded in memory-mapped registers. These can be read from the internal configuration interface by CPU 110.

The L2 Error Detection Status Register (L2EDSTAT) indicates the status of the error detection logic. FIG. 10 illustrates the fields of L2EDSTAT. L2EDSTAT is loaded with appropriate data following each memory operation. As shown in FIG. 10 L2EDSTAT is a 32-bit register. The bit codings of the fields in L2EDSTAT are shown in Table 2 below. Bit 0 of L2EDSTAT is the EN field. The EN field indicates whether error detection/parity generation is enabled. Bit 1 is reserved. Bit 2 is the DIS field. The DIS fields indicates whether error detection/parity generation is disabled. Bit 3 is the SUSP field. The SUSP field indicates whether error detection/parity generation is suspended. In the SUSP mode, parity information is not written to the parity RAM, but data is still written to the L2 RAM. Bit 4 is the DERR field. The DERR field indicates whether a parity error occurred during CPU/DMC data access. Bit 5 is the IERR field. The IERR field indicates whether a parity error occurred during CPU/PMC data access. Bit 6 is the DMAERR field. The DMAERR field indicates whether a parity error occurred during DMA access. Bit 7 is the VERR field. The VERR indicates whether a parity error occurred during L2 victim access. Bits 8 and 9 are the NERR field. The NERR field indicates whether there was a single bit error, a double bit error or an error in the parity value with the data correct. Bits 10 to 15 are reserved. Bits 16 to 23 are the BITPOS field. The digital number indicated by the 8 bits of the BITPOS field is the bit position of a single bit error. Bits 24 to 31 are reserved.

TABLE 2

| Field | Description |
|---|---|
| EN | EN = 0: Error detection/parity generation logic is not enabled |
| | EN = 1: Error detection/parity generation logic is enabled |
| DIS | DIS = 0: Error detection/parity generation logic is not disabled |
| | DIS = 1: Error detection/parity generation logic is disabled |
| SUSP | SUSP = 0: Parity generation logic is not suspended |
| | SUSP = 1: Parity generation logic is suspended |
| DERR | DERR = 0: No parity error occurred during CPU/DMC data access |
| | DERR = 1: Parity error occurred during CPU/DMC access |
| IERR | IERR = 0: No parity error occurred during CPU/PMC access |
| | IERR = 1: Parity error occurred during CPU/PMC access |
| DMAERR | DMAERR = 0: No parity error occurred during DMA access |
| | DMAERR = 1: Parity error occurred during DMA access |
| VERR | VERR = 0: No parity error occurred during L2 victim access |
| | VERR = 1: Parity error occurred during L2 victim access |
| NERR | NERR = 00: Single bit error |
| | NERR = 01: Double bit error |
| | NERR = 10: Reserved |
| | NERR = 11: Error in parity value (data is correct) |
| BITPOS | BITPOS = 00000000: Single bit error in position 0 . . . |
| | BITPOS = 11111111: Single bit error in position 255 |

The BITPOS field is valid only for single bit errors. The BITPOS field records the position of bank with error with 0 to 128 indicating Bank0 and 128 to 255 indicating Bank1. The BITPOS field indicates the position of the error in a 256-bit data packet. This works well for code (PMC 620). For DMA accesses of 128 bits, the BITPOS field records the position with respect to the bank accessed. If any 2-bit errors are detected on either bank, 2-bit error recording is prioritized. In this case the BITPOS field is irrelevant. For 1-bit errors in both banks, the lower bank position has precedence. The BITPOS field indicates the bit position of the error in the lower bank only.

Error Detection Address Register (L2EDADDR)

The L2 Error Detection Address Register (L2EDADDR) indicates the location/address of the error. FIG. 11 illustrates the fields of L2EDADDR. L2EDADDR is loaded with appropriate data following each memory operation. As shown in FIG. 11 L2EDADDR is a 32-bit register. The bit codings of the fields in L2EDADDR are shown in Table 3 below. Bit 0 is the SRAM field. The SRAM field indicates whether the error occurred in L2 cache or L2 directly addressable memory (SRAM). Bits 1 and 2 are reserved. Bits 3 and 4 are the L2WAY field. These two bits indicate in which of the 4 ways of L2 cache 130 was the error detected. Bits 5 to 31 are the ADDR field. The ADDR field indicates the address of the parity error. The 5 least significant bits of the address are assumed to be zero. Thus the ADDR field only indicates the address on 64-bit boundaries.

TABLE 3

| Field | Description |
| --- | --- |
| SRAM | SRAM = 0: Error detected in L2 cache |
|  | SRAM = 1: Error detected in L2 SRAM |
| L2WAY | L2WAY = 00: Error detected in Way 0 of L2 cache |
|  | L2WAY = 01: Error detected in Way 1 of L2 cache |
|  | L2WAY = 10: Error detected in Way 2 of L2 cache |
|  | L2WAY = 11: Error detected in Way 3 of L2 cache |
| ADDR | Address of parity error (5 LSBs assumed to be 000000b). |

Error Detection Command

The UMC Error Detection Command Register (L2EDCMD) facilitates clearing the error reported in the L2EDSTAT register and allows the error detection and parity generation logic to be enabled, disabled, or suspended. FIG. 12 illustrates the fields of L2EDCMD. As shown in FIG. 12 L2EDCMD is a 32 bit register. The bit codings of L2EDCMD are shown in Table 4 below. Bit 0 is the EN field. The EN when set re-enables error detection/parity generation. Bit 1 is reserved. Bit 2 is the DIS field. The DIS field when set disables error detection/parity generation. Bit 3 is the SUDP field. The SUSP field when set suspends parity generation. Bit 4 is the DCLR field. The DCLR field when set clears a data fetch parity error bit and resets the error address in L2EDSTAT. Bit 5 is the ICLR field. The ICLR field when set clears a program fetch parity error bit and resets the error address in L2EDSTAT. Bit 6 is the DMACLR field. The DMACLR field when set clears a DMA read parity error bit and resets the error address in L2EDSTAT. Bit 7 is the VCLR field. The VCLR field when set clears the L2 victim read parity error bit and resets the error address in L2EDSTAT.

TABLE 4

| Field | Description |
| --- | --- |
| EN | EN = 0: No effect |
|  | EN = 1: (Re)enable error detection/parity generation logic |
| DIS | DIS = 0: No effect |
|  | DIS = 1: Disable error detection/parity generation logic |
| SUSP | SUSP = 0: No effect |
|  | SUSP = 1: Suspend parity generation logic |
| DCLR | DCLR = 0: No effect |
|  | DCLR = 1: Data fetch parity error bit cleared and Address reset in L2EDSTAT |
| ICLR | ICLR = 0: No effect |
|  | ICLR = 1: Program fetch parity error bit cleared and Address reset in L2EDSTAT |
| DMACLR | DMACLR = 0: No effect |
|  | DMACLR = 1: DMA read parity error bit cleared and Address reset in L2EDSTAT |
| VCLR | VCLR = 0: No effect |
|  | VCLR = 1: L2 victim read parity error bit cleared and Address reset in L2EDSTAT |

Error Detection Event Counters

The EDC logic counts the number of correctable and non-correctable parity errors that occur and saves them to two 8-bit configuration registers. FIG. 13 illustrates these two configuration register L2EDCPEC and L2EDNPEC. L2EDCPEC has an 8-bit CNT field and the most significant bits are reserved. The CNT field of L2EDCPEC holds the Correctable Parity Error Count. L2EDNPEC has an 8-bit CNT field and the most significant bits are reserved. The CNT field of L2EDNPEC holds the Non-correctable Parity Error. The CNT fields of both these registers is reset on write to them. These CNT fields clamp at all ones (hex FF) until cleared. If errors are detected on both 128-bit reads, both will be counted.

In the preferred embodiment of this invention EDC always performs full error detection and correction on all program fetches from PMC 620 and full EDC on L2 victim readouts. Full EDC on 128-bit wide DMA accesses is also performed. Preferably the EDC block provides both parity-check based and Hamming code based single-bit Error-Detection and Hamming code based two-bit Error-Detection on data fetches from DMC 610. EDC correction for DMC 610 accesses are not performed as this would add an extra cycle on DMC 610 data return. Error detection and exceptions are performed after the data is returned to DMC 610. This removes the error detection delay from the cost of L1D cache 123 misses.

This invention provides a configurable method for disabling and enabling error detection and correction per requestor granularity as described in above paragraph. This invention limits the interrupts in a system and frees up CPU service routines. This also limits dynamic power in a system.

The preferred embodiment of this invention is a configurable method to disable/enable error detection and correction for all masters and requestors which access data protected by parity logic.

The preferred embodiment of this invention provides a configurable method and optimizes the number of bits used for enabling and disabling EDC for independent masters/requestors. Each configurable bit controls the ability of a corresponding requestor to detect and correct soft errors. This enables or disables all surrounding logic associated with such accesses including interrupts, error logging and the like. This minimizes the CPU service routines to service such interrupts.

The L2 EDC enable register (L2EDCEN) controls error detection and correction in L2 memory accesses. The read/write permissions on this register are same as the read/write permissions of L2EDCMD register illustrated in FIG. 12 of secure supervisor write. The L2EDCEN register bits are 0 by default. The user has only to write a 1 to the L2EDCMD register EN field to enable EDC. FIG. 14 illustrates the fields of L2EDCEN. As shown in FIG. 14 L2EDCEN is a 32 bit register. The bit codings of L2EDCEN are shown in Table 5 below. Error detection/Correction is performed for a given request only when all of the following are true: EDC mode in L2EDCMD is enabled (see Table 4); and error detection/correction enable bit for the given requestor is 1 in L2EDCEN (see Table 5). UMC 630 receives requests to L2 cache 130 from the following requestors: PMC 620; DMC 620; SDMA; L2 cache 130 victims; and L2 cache 130 cache accesses.

Bit 0 is the DL2CEN field. The DL2CEN field determines whether error detection and correction is performed on DMC reads from an external address (Hits L2 cache).

Bit 1 is the PL2CEN field. The PL2CEN field determines whether error detection and correction is performed on PMC reads from an external address (Hits L2 cache).

Bit 2 is the DL2SEN field. The DL2SEN field determines whether error detection and correction is performed on DMC read from L2SRAM.

Bit 3 is the PL2SEN field. The PL2SEN field determines whether error detection and correction is performed on MC read from L2SRAM.

Bit 4 is the SDMAEN field. The SDMSEN field determines whether error detection and correction is performed on EDC on SDMA read from L2SRAM. This includes SRAM under cache.

TABLE 5

| Field | Description |
| --- | --- |
| DL2CEN | DL2CEN = 1: Enables EDC on DMC reads from an external address (Hits L2 cache) if L2EDCMD is enabled<br>DL2CEN = 0: Disables EDC on DMC reads from an external address (Hits L2 cache) |
| PL2CEN | PL2CEN = 1: Enables EDC on PMC reads from an external address (Hits L2 cache) if L2EDCMD is enabled<br>PL2CEN = 0: Disables EDC on PMC reads from an external address (Hits L2 cache) |
| DL2SEN | DL2SEN = 1: Enables EDC on DMC read from L2SRAM (if L2EDCMD is enabled)<br>DL2SEN = 0: Disables EDC on DMC read from L2SRAM |
| PL2SEN | PL2SEN = 1: Enables EDC on PMC read from L2SRAM (if L2EDCMD is enabled)<br>PL2SEN = 0: Disables EDC on PMC read from L2SRAM |
| SDMAEN | SDMAEN = 1: Enables EDC on SDMA read from L2SRAM (if L2EDCMD is enabled). This includes SRAM under cache<br>SDMAEN = 0: Disables EDC on SDMA read from L2SRAM |

EDC parity RAM never gets written if the EDC mode is in Suspend SUSP mode. EDC parity RAM always gets written if the EDC mode is Enabled or Disabled in L2EDCMD. If wbyten !=0×F, then valid=0, parity=0. If wbyten==0×F, then valid=1, parity=Hamming parity Generating and writing correct parity in disabled mode is permitted. If there is an issue with parity generation and there is a risk EDC is not working, then the user can switch to suspend or disable mode and prevent exceptions.

What is claimed is:

1. A memory system comprising:
   a first data source having N bits;
   a first parity generator connected to said first data source generating parity bits corresponding to said N bits;
   a second data source having 2N bits;
   a second parity generator connected to an upper half of bits of said second data source generating parity bits corresponding to N upper half bits;
   a third parity generator connected to a lower half of bits of said second data source generating parity bits corresponding to N lower half bits;
   a first multiplexer having a first input connected to said first parity generator receiving both said N bits and corresponding parity bits, a second input connected to said second parity generator receiving both said N upper half bits and corresponding parity bits and an output;
   a second multiplexer having a first input connected to said first parity generator receiving both said N bits and corresponding parity bits, a second input connected to said third parity generator receiving both said N lower half bits and corresponding parity bits and an output;
   a memory including
      a first memory bank having a write data input connected to said output of said first multiplexer, and
      a second memory bank having a write data input connected to said output of said second multiplexer; and
   wherein the memory system controls said first and second multiplexers to perform one of
      select said first input as output of said first multiplexer and select no input as output of said second multiplexer thereby storing said N bits and said corresponding parity bits of said first data source in said first memory bank,
      select no input as output of said first multiplexer and select said first input of said second multiplexer thereby storing said N bits of said first data source and said corresponding parity bits in said second memory bank, and
      select said second input of said first multiplexer and select said second input of said second multiplexer thereby storing said N upper half bits of said second data source and said corresponding parity bits in said first memory bank and storing said N lower half bits of said second data source and said corresponding parity bits in said second memory bank.

2. The memory system of claim 1, further comprising:
   a third data source having 2N bits;
   a fourth parity generator connected to an upper half of bits of said third data source generating parity bits corresponding to N upper half bits;
   a fifth parity generator connected to a lower half of bits of said third data source generating parity bits corresponding to N lower half bits;
   said first multiplexer further having a third input connected to said fourth parity generator receiving both said N upper half bits and corresponding parity bits;
   said second multiplexer further having a third input connected to said fifth parity generator receiving both said N lower half bits and corresponding parity bits;
   wherein the memory system further controls said first and second multiplexers to
      select said third input of said first multiplexer and select said third input of said second multiplexer thereby storing said N upper half bits of said third data source and said corresponding parity bits in said first memory bank and storing said N lower half bits of said third data source and said corresponding parity bits in said second memory bank.

3. The memory system of claim 1, wherein:
   N is 128.

4. The memory system of claim 1, further comprising:
   a third multiplexer having a first input connected to said first memory bank receiving N bits recalled from said first memory bank, a second input and an output;
   a first parity detector/corrector connected to said first memory bank operable to
      generate parity bits corresponding to N bits recalled from said first memory bank,
      compare said generated parity bits with said corresponding recalled parity bits,
      if said generated parity bits match said corresponding recalled parity bits, controlling said third multiplexer to select said first input thereby outputting said N bits recalled from said first memory bank, and
      if said generated parity bits do not match said corresponding recalled parity bits, generating corrected N bits from said N bits recalled for said first memory bank and said corresponding parity bits, supplying said corrected bits to said second input of said third multiplexer and controlling said third multiplexer to select said second input thereby outputting said corrected N bits;

a fourth multiplexer having a first input connected to said second memory bank receiving N bits recalled from said second memory bank, a second input and an output;

a second parity detector/corrector connected to said second memory bank operable to
generate parity bits corresponding to N bits recalled from said second memory bank,
compare said generated parity bits with said corresponding recalled parity bits,
if said generated parity bits match said corresponding recalled parity bits, controlling said fourth multiplexer to select said first input thereby outputting said N bits recalled from said second memory bank, and
if said generated parity bits do not match said corresponding recalled parity bits, generating corrected N bits from said N bits recalled from said second memory bank and said corresponding parity bits, supplying said corrected bits to said second input of said fourth multiplexer and controlling said fourth multiplexer to select said second input thereby outputting said corrected N bits; and a first output connected to said output of said third multiplexer and said output of said fourth multiplexer to output 2N bits.

5. The memory system of claim 4, further comprising:
a fifth multiplexer having a first input connected to said output of said third multiplexer, a second input connected to said output of said fourth multiplexer and an output;
a second output connected to said output of said fifth multiplexer to output N bits selected by said fifth multiplexer.

6. The memory system of claim 4, further comprising:
a third output to said first memory bank receiving N bits recalled from said first memory bank and to said second memory bank receiving N bits recalled from said second memory bank to output 2N bits.

7. The memory system of claim 4, wherein:
said first parity detector/corrector is further operable to generate an exceptions output if said generated parity bits do not match said corresponding recalled parity bits and said first parity detector/corrector is unable to generate corrected N bits from said N bits recalled from said first memory bank and said corresponding parity bits; and
said second parity detector/corrector is further operable to generate an exceptions output if said generated parity bits do not match said corresponding recalled parity bits and said second parity detector/corrector is unable to generate corrected N bits from said N bits recalled from said second memory bank and said corresponding parity bits.

* * * * *